(12) United States Patent
Wang et al.

(10) Patent No.: US 11,751,449 B2
(45) Date of Patent: Sep. 5, 2023

(54) ARRAY SUBSTRATE, DISPLAY PANEL, AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Zhongjie Wang, Beijing (CN); Zhongliu Yang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 255 days.

(21) Appl. No.: 17/271,035

(22) PCT Filed: May 29, 2020

(86) PCT No.: PCT/CN2020/093302
§ 371 (c)(1),
(2) Date: Feb. 24, 2021

(87) PCT Pub. No.: WO2020/248837
PCT Pub. Date: Dec. 17, 2020

(65) Prior Publication Data
US 2021/0327997 A1 Oct. 21, 2021

(30) Foreign Application Priority Data
Jun. 12, 2019 (CN) .......................... 201910504667.8

(51) Int. Cl.
*H10K 59/131* (2023.01)
*H10K 59/123* (2023.01)

(52) U.S. Cl.
CPC ......... *H10K 59/131* (2023.02); *H10K 59/123* (2023.02)

(58) Field of Classification Search
CPC ............. H01L 27/3241; H01L 27/3244; H01L 27/3246; H01L 27/3262; H01L 27/3276;
(Continued)

(56) References Cited

U.S. PATENT DOCUMENTS 7,336,036 B2    2/2008  Furuie et al.
8,334,859 B2   12/2012  Liu et al.
(Continued)

FOREIGN PATENT DOCUMENTS

CN    1388504 A    1/2003
CN    1689063 A   10/2005
(Continued)

OTHER PUBLICATIONS

Office Action dated Apr. 29, 2020, issued in counterpart CN application No. 201910504667.8, with English translation. (21 pages).

(Continued)

*Primary Examiner* — Joseph C. Nicely
(74) *Attorney, Agent, or Firm* — WHDA, LLP

(57) ABSTRACT

An array substrate, a display panel and a display device are provided. The array substrate includes: a base substrate; a plurality of pixel units in an array on the base substrate; and a first power line and a second power line arranged on the base substrate and configured to respectively provide a first power signal and a second power signal to the pixel units. At least one of the pixel units includes: a first-color light emitting device; a second-color light emitting device; a first pixel driving circuit configured to drive the first-color light emitting device; and a second pixel driving circuit configured to drive the second-color light emitting device. The first pixel driving circuit is electrically connected to the first power line, the second pixel driving circuit is electrically
(Continued)

connected to the second power line, the first power line and the second power line are insulated from each other.

17 Claims, 4 Drawing Sheets

(58) Field of Classification Search
CPC ............ H01L 27/3288; H01L 27/3293; H10K 59/123; H10K 59/131
See application file for complete search history.

(56) References Cited

U.S. PATENT DOCUMENTS

| | | |
|---|---|---|
| 2002/0180671 A1 | 12/2002 | Inukai |
| 2005/0030268 A1 | 2/2005 | Zhang et al. |
| 2006/0170712 A1 | 8/2006 | Miller et al. |
| 2008/0123001 A1 | 5/2008 | Furuie et al. |
| 2009/0201281 A1 | 8/2009 | Routley et al. |
| 2011/0049523 A1* | 3/2011 | Choi ................... H01L 27/1225 438/34 |
| 2012/0056904 A1 | 3/2012 | Lhee et al. |
| 2012/0139959 A1 | 6/2012 | Kim |
| 2015/0228223 A1 | 8/2015 | Park |
| 2016/0063911 A1 | 3/2016 | Wu et al. |
| 2017/0309651 A1* | 10/2017 | Kim ....................... G02F 1/1345 |
| 2019/0214450 A1* | 7/2019 | Lee ....................... G09G 3/3283 |
| 2021/0225983 A1 | 7/2021 | Wu |

FOREIGN PATENT DOCUMENTS

| | | | | |
|---|---|---|---|---|
| CN | 101026184 A | | 8/2007 | |
| CN | 101263543 A | | 9/2008 | |
| CN | 101894860 A | | 11/2010 | |
| CN | 102354479 A | | 2/2012 | |
| CN | 102486910 A | | 6/2012 | |
| CN | 103199096 A | * | 7/2013 | ............. H01L 27/77 |
| CN | 103199096 A | | 7/2013 | |
| CN | 105448951 A | | 3/2016 | |
| CN | 107871772 A | * | 4/2018 | ........... G09G 3/3233 |
| CN | 107871772 A | | 4/2018 | |
| CN | 109713022 A | * | 5/2019 | ......... H01L 27/3262 |
| CN | 109713022 A | | 5/2019 | |
| CN | 110136651 A | | 8/2019 | |
| JP | 2004295131 A | * | 10/2004 | ........... G09G 3/3233 |
| KR | 20140140965 A | * | 5/2013 | ........... G09G 3/3233 |

OTHER PUBLICATIONS

Office Action dated Aug. 7, 2020, issued in counterpart CN application No. 201910504667.8, with English translation. (19 pages).
Office Action dated Dec. 3, 2020, issued in counterpart CN application No. 201910504667.8, with English translation. (14 pages).
International Search Report dated Aug. 31, 2020, issued in counterpart International application No. PCT/CN2020/093302, with English translation. (9 pages).
Written Opinion dated Aug. 31, 2020, issued in counterpart International application No. PCT/CN2020/093302. (4 pages).

* cited by examiner

ARRAY SUBSTRATE, DISPLAY PANEL, AND DISPLAY DEVICE

CROSS-REFERENCE TO RELATED APPLICATION

This application claims priority to Chinese Patent Application No. 201910504667.8, filed on Jun. 12, 2019, the content of which is incorporated herein by reference in its entirety.

TECHNICAL FIELD

The present disclosure relates to the field of semiconductor technology, and in particular to an array substrate, a display panel and a display device.

BACKGROUND

Flat Panel Display (FPD) has become a mainstream product in the market. There are more and more types of flat panel displays, such as Liquid Crystal Display (LCD), Organic Light Emitting Diode (OLED) display, Plasma Display Panel (PDP) and Field Emission Display (FED).

Active-matrix Organic Light Emitting Diode (AMOLED) is expected to become a new generation of display technology after LCD due to its advantages of self-luminescence, low power consumption, high contrast, wide viewing angle, and high color gamut. However, the OLED display panel in the related art has problems of mid-to-high grayscale color shift and cyan display when displaying mid-to-high grayscale images.

SUMMARY

Some embodiments of the present disclosure provide an array substrate, including: a base substrate; a plurality of pixel units arranged in an array on the base substrate; and a first power line and a second power line arranged on the base substrate and configured to respectively provide a first power signal and a second power signal to the plurality of pixel units, wherein at least one of the pixel units includes: a first-color light emitting device; a second-color light emitting device; a first pixel driving circuit configured to drive the first-color light emitting device; and a second pixel driving circuit configured to drive the second-color light emitting device; wherein the first pixel driving circuit is electrically connected to the first power line, the second pixel driving circuit is electrically connected to the second power line, and the first power line and the second power line are insulated from each other.

In some embodiments, the at least one pixel unit further includes: a third-color light emitting device; and a third pixel driving circuit configured to drive the third-color light emitting device, wherein the third pixel driving circuit is electrically connected to the second power line.

In some embodiments, the first power line and the second power line are located in different layers.

In some embodiments, each of the first pixel driving circuit, the second pixel driving circuit and the third pixel driving circuit includes a thin film transistor configured to drive one of the first-color light emitting device, the second-color light emitting device and the third-color light emitting device; the thin film transistor includes a source electrode and a drain electrode which are located in a source/drain electrode layer; and at least a portion of the second power line is arranged in the same layer as the source electrode and drain electrode of the thin film transistor.

In some embodiments, each of the first-color light emitting device, the second-color light emitting device and the third-color light emitting device includes an anode located on a side of the thin film transistor away from the base substrate, the anode is located in an anode layer, and the first power line is located between the source/drain electrode layer and the anode layer.

In some embodiments, the array substrate further includes: a first insulating layer arranged between the first power line and the source/drain electrode layer; and a second insulating layer arranged between the first power line and the anode layer.

In some embodiments, the first pixel driving circuit includes a first power terminal located in the source/drain electrode layer, and the first power line is electrically connected to the first power terminal through a first via hole penetrating the first insulating layer.

In some embodiments, the array substrate further includes a connecting electrode arranged in the same layer as the first power line; the anode of the first-color light emitting device is electrically connected to the connecting electrode through a second via hole penetrating the second insulating layer, and the connecting electrode is electrically connected to the drain electrode of the thin film transistor in the first pixel driving circuit through a third via hole penetrating the first insulating layer.

In some embodiments, the second pixel driving circuit includes a second power terminal, and the third pixel driving circuit includes a third power terminal; the second power terminal and the third power terminal are located in the source/drain electrode layer; the at least portion of the second power line is in electrical contact with the second power terminal or the third power terminal.

In some embodiments, the anode of the second-color light emitting device is electrically connected to the drain electrode of the thin film transistor in the second pixel driving circuit through a fourth via hole penetrating the first insulating layer and the second insulating layer; and/or the anode of the third-color light emitting device is electrically connected to the drain electrode of the thin film transistor in the third pixel driving circuit through a fifth via hole penetrating the first insulating layer and the second insulating layer.

In some embodiments, the first power line includes a first sub-line extending in a first direction and electrically connected to the first pixel driving circuit.

In some embodiments, the first power line further includes a second sub-line extending in a second direction intersecting the first direction, wherein the second sub-line is electrically connected to the first sub-line.

In some embodiments, the first power line further includes a third sub-line arranged around the plurality of pixel units, wherein the third sub-line is electrically connected to the first sub-line and the second sub-line.

In some embodiments, the first sub-line, the second sub-line and the third sub-line are integrally formed.

In some embodiments, the second power line includes a fourth sub-line extending in the first direction and electrically connected to the second pixel driving circuit or the third pixel driving circuit, wherein the fourth sub-line is arranged in the same layer as the source electrode and drain electrode of the thin film transistor.

In some embodiments, the second power line further includes a fifth sub-line extending in a second direction intersecting the first direction, wherein the fifth sub-line is arranged in a different layer from the fourth sub-line, an orthographic projection of the fifth sub-line on the base substrate has a first overlapping area with an orthographic projection of the fourth sub-line on the base substrate, and the fifth sub-line is electrically connected to the fourth sub-line through a sixth via hole located in the first overlapping area.

In some embodiments, the thin film transistor further includes a gate electrode located in a first gate electrode layer that is located on a side of the source/drain electrode layer close to the base substrate, and the fifth sub-line is located in a second gate electrode layer provided between the first gate electrode layer and the source/drain electrode layer.

In some embodiments, the first power line further includes a sixth sub-line arranged around the plurality of pixel units, wherein the sixth sub-line is arranged in the same layer as the fourth sub-line and is electrically connected to the fourth sub-line, the orthographic projection of the fifth sub-line on the base substrate has a second overlapping area with an orthographic projection of the sixth sub-line on the base substrate, and the fifth sub-line is electrically connected to the sixth sub-line through a seventh via hole located in the second overlapping area.

In some embodiments, the fourth sub-line and the sixth sub-line are integrally formed.

Some embodiments of the present disclosure provide a display panel, including the array substrate described in the above embodiments.

Some embodiments of the present disclosure provide a display device, including the display panel described in the above embodiments.

DETAILED DESCRIPTION OF EMBODIMENTS

Figure 1:
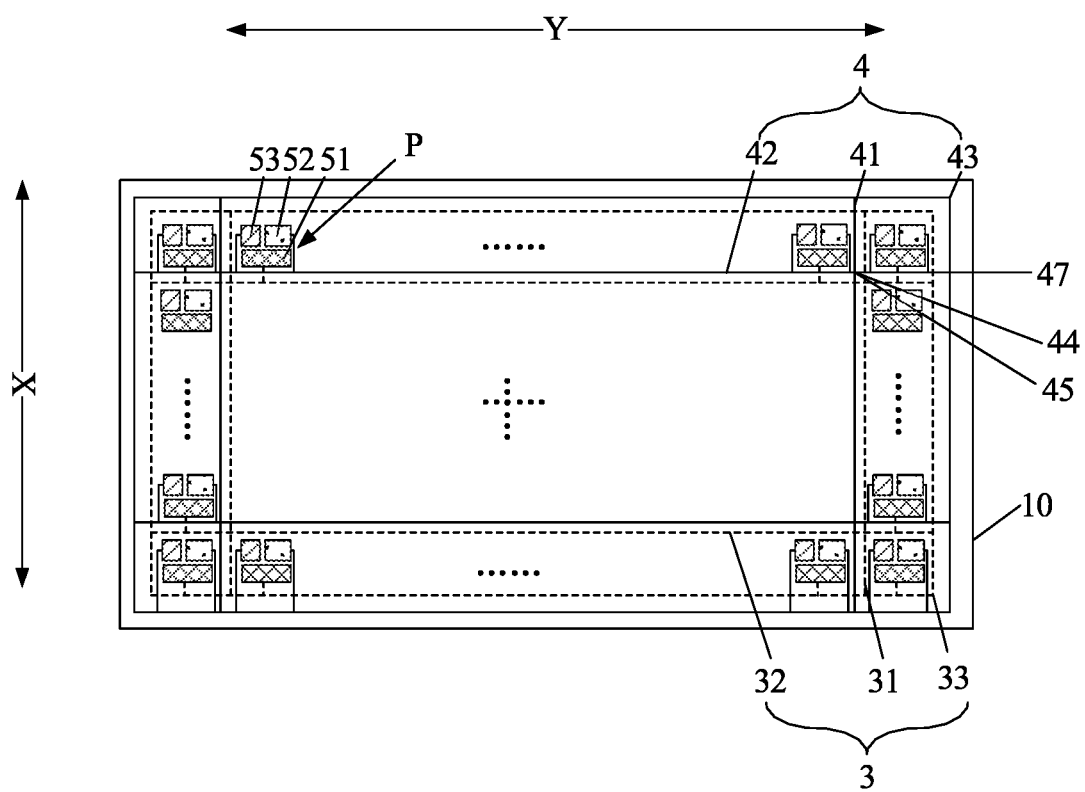
FIG. 1 shows a schematic structural diagram of an array substrate according to some embodiments of the present disclosure.

In order to make the objectives, technical solutions and advantages of the present disclosure more clear, the technical solutions of the present disclosure are clearly and completely described below with reference to the drawings of the embodiments of the present disclosure. Obviously, the described embodiments are only a part but not all of the embodiments of the present disclosure. Based on the embodiments of the present disclosure, all other embodiments obtained by persons of ordinary skill in the art without carrying out creative work fall within the protection scope of the present disclosure.

Unless otherwise defined, technical terms or scientific terms used in the present disclosure shall be of the general meaning understood by the ordinary skilled in the art. The words "first," "second," and the like used in the present disclosure do not denote any order, quantity, or importance, but are used to distinguish different components. The words "comprising," "including" and the like indicate that the element or item preceding the word contains the elements or items listed following the word as well as the equivalents, but do not exclude other elements or items. The words "connected," "coupled," or the like are not limited to physical or mechanical connections, but may include electrical connections, whether direct or indirect. The words "upper," "lower," "left," "right" and the like are only used to indicate relative positional relationship, and when the absolute position of the object described is changed, the relative positional relationship may also be correspondingly changed.

In order to keep the following description of the embodiments of the present disclosure clear and concise, detailed descriptions of known functions and known components are omitted in the present disclosure.

The expressions "located in the same layer," "arranged in the same layer" or the like in the present disclosure refer to being formed of the same material using the same patterning process. For example, a first element or component and a second element or component being "located in the same layer" or "arranged in the same layer" means that the first element or component and the second element or component are formed of the same material using the same patterning process. A distance between the first element or component and a base substrate carrying the first and second elements or components may be the same as or different from a distance between the second element or component and the base substrate.

In the embodiments of the present disclosure, an OLED display panel is illustrated by way of example. Those skilled in the art may understand that the present disclosure is not limited to the OLED display panel and may also include an electroluminescent display panel such as PLED.

In the related art, in a conventional array substrate of the OLED display panel, power lines corresponding to a red light emitting device, a green light emitting device and a blue light emitting device of each pixel unit are connected together. When mid-to-high grayscale images are displayed, a current path of the blue light emitting device with a large current consumption may occupy a current path of the green light emitting device which is a main light emitting device, resulting in the problems of mid-to-high grayscale color shift and insufficient white image brightness in the OLED display panel.

Some embodiments of the present disclosure provide an array substrate, including: a base substrate, a plurality of pixel units, and a first power line and a second power line. The plurality of pixel units are arranged in an array on the base substrate. The first power line and the second power line are arranged on the base substrate and are configured to respectively provide a first power signal and a second power signal to the plurality of pixel units. At least one of the pixel units includes a first-color light emitting device, a second-color light emitting device, a first pixel driving circuit, and a second pixel driving circuit. The first pixel driving circuit is configured to drive the first-color light emitting device, and the second pixel driving circuit is configured to drive the second-color light emitting device. The first pixel driving circuit is electrically connected to the first power line, the second pixel driving circuit is electrically connected to the second power line, and the first power line and the second power line are insulated from each other.

The first pixel driving circuit for driving the first-color light emitting device and the second pixel driving circuit for driving the second-color light emitting device are electrically connected to different power lines, namely, the first power line and the second power line, and are respectively driven by independent power lines, which may improve the problems of mid-to-high grayscale color shift and cyan display in the OLED display panel in the related art when displaying mid-to-high grayscale images.

Figure 2:
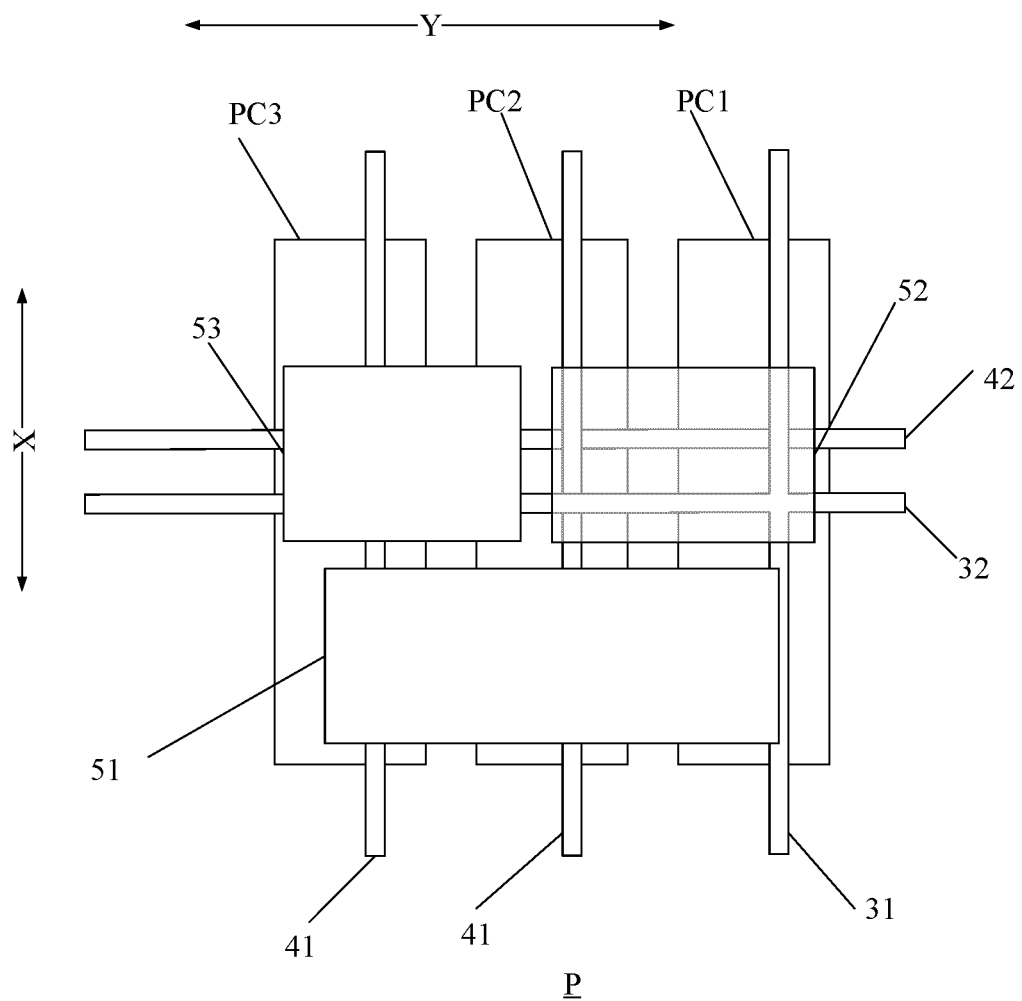
FIG. 2 shows a schematic structural diagram of a pixel unit in FIG. 1.

FIG. 1 shows a schematic structural diagram of an array substrate according to some embodiments of the present disclosure. FIG. 2 shows a schematic structural diagram of a pixel unit in FIG. 1. Referring to FIG. 1, some embodiments of the present disclosure provide an array substrate, including a base substrate 11, a plurality of pixel units P, and a first power line 3 and a second power line 4. The plurality of pixel units P are arranged in an array on the base substrate 11. The first power line 3 is arranged on the base substrate 11 and is configured to provide a first power signal ELVDD1 to each of the plurality of pixel units P. The second power line 4 is arranged on the base substrate 11 and is configured to provide a second power signal ELVDD2 to each of the plurality of pixel units P. In FIG. 1, in order to clearly distinguish the first power line 3 and the second power line 4, the first power line 3 is shown by a broken line, and the second power line 4 is shown by a solid line.

FIG. 2 shows a schematic structural diagram of a single pixel unit in FIG. 1. As shown in FIG. 2, each pixel unit P includes a first-color light emitting device 51, a second-color light emitting device 52, a first pixel driving circuit PC1, and a second pixel driving circuit PC2. The first-color light emitting device 51 is, for example, a blue light emitting device, and is also referred to as a blue light emitting device min the following embodiments. The second-color light emitting device 52 is, for example, a green light emitting device, and is also referred to as a green light emitting device in the following embodiments. The first pixel driving circuit PC1 is configured to drive the blue light emitting device to emit light, and the second pixel driving circuit PC2 is configured to drive the green light emitting device to emit light. As shown in FIGS. 1 and 2, the first pixel driving circuit PC1 has a first power terminal electrically connected to the first power line 3, and the second pixel driving circuit PC2 has a second power terminal electrically connected to the second power line 4. The first power line 3 and the second power line 4 are insulated from each other. In these embodiments, the first pixel driving circuit PC1 corresponding to the blue light emitting device and the second pixel driving circuit PC2 corresponding to the green light emitting device are electrically connected to different power lines, that is, the first power line 3 and the second power line 4. In other words, the first pixel driving circuit PC1 corresponding to the blue light emitting device and the second pixel driving circuit PC2 corresponding to the green light emitting device are respectively driven by independent power lines, which may improve the problems of mid-to-high grayscale color shift and cyan display in the OLED display panel in the related art when displaying mid-to-high grayscale images. This avoids the problems of mid-to-high grayscale color shift and insufficient white image brightness in the OLED display panel when displaying mid-to-high grayscale images due to the current path of the blue light emitting device with a large current consumption may occupy the current path of the green light emitting device which is a main light emitting device in the case that in the array substrate of the OLED display panel, the power lines corresponding to the red light emitting device, the green light emitting device and the blue light emitting device of each pixel unit P are connected together.

In some embodiments, as shown in FIGS. 1 and 2, each pixel unit P further includes a third-color light emitting device 53 and a third pixel driving circuit PC3. The third-color light emitting device 53 is, for example, a red light emitting device, and is also referred to as a red light emitting device in the following embodiments. The third pixel driving circuit PC3 is configured to drive the red light emitting device to emit light, and has a third power terminal electrically connected to the second power line 4.

As shown in FIGS. 1 and 2, the first power line 3 may specifically include a first sub-line 31 extending in a first direction X (such as a column direction), a second sub-line 32 extending in a second direction Y (such as a row direction), and a third sub-line 33 surrounding the plurality of pixel units P. The first sub-line 31 is, for example, a first vertical power line, and is also referred to as a first vertical power line 31 in the following embodiments. The first vertical power line 31 is electrically connected to the first pixel driving circuit PC1, and specifically to the first power terminal of the first pixel driving circuit PC1. The second sub-line 32 is, for example, a first horizontal power line, and is also referred to as a first horizontal power line 32 in the following embodiments. The first horizontal power line 32 intersects with the first vertical power line 31, and the two are electrically connected at the intersection. The third sub-line 33 is, for example, a first closed loop line, and is also referred to as a first closed loop line 33 in the following embodiments. The first vertical power line 31 is electrically connected to the first closed loop line at both ends, and the first horizontal power line 32 is electrically connected to the first closed loop line at both ends. In this embodiment, the first power line 3 is grid-shaped as a whole, which may effectively reduce a voltage drop (IR drop) of the first power line 3 compared to the case where the power line only includes vertical power lines in the related art.

The second power line 4 may specifically include a fourth sub-line 41 extending in the first direction X (such as the column direction), a fifth sub-line 42 extending in the second direction Y (such as the row direction), and a sixth sub-line 33 surrounding the plurality of pixel units P. The fourth sub-line 41 is, for example, a second vertical power line, and is also referred to as a second vertical power line 41 in the following embodiments. The second vertical power line 41 is electrically connected to the second pixel driving circuit PC2 or the third pixel driving circuit PC3, and specifically to the second power terminal of the second pixel driving circuit PC2 or the third power terminal of the third pixel driving circuit PC3. The fifth sub-line 42 is, for example, a second horizontal power line, and is also referred to as a second horizontal power line 42 in the following embodiments. The second horizontal power line 42 intersects with the second vertical power line 41, and the two are electrically connected at the intersection. The sixth sub-line 43 is, for example, a second closed loop line, and is also referred to as a second closed loop line in the following embodiments. The second vertical power line 41 is electrically connected to the second closed loop line at both ends, and the second horizontal power line 42 is electrically connected to the second closed loop line at both ends. The second power line 4 is grid-shaped as a whole, which may effectively reduce a voltage drop (IR drop) of the second power line 4 compared to the case where the power line only includes vertical power lines in the related art. In the embodiments of the present disclosure, the pixel units P are arranged in an array, and the power lines, such as the first power line 3 and the second power line 4, are grid-shaped. Thus, the pixel units P at different positions receive substantially the same first power signals and substantially the same second power signals, which is beneficial to the display uniformity and enhances the display effect.

Those skilled in the art may understand that FIG. 1 merely shows that the first power line 3 and the second power line 4 are both grid-shaped structures, and each pixel unit P is electrically connected to the first power line 3 and the second power line 4. As shown in FIG. 1, each of the first vertical power line 31 and the second vertical power line 41 is located between adjacent columns of the pixel units, and each of the first horizontal power line 32 and the second horizontal power line 42 is located between adjacent rows of the pixel units. In fact, however, as shown in FIG. 2, the first vertical power line 31 passes through the pixel unit P along the first direction X, for example, passes through the first pixel driving circuit PC1 along the first direction X. That is to say, an orthographic projection of the first vertical power line 31 on the base substrate 11 has an overlapping area with an orthographic projection of the first pixel driving circuit PC1 on the base substrate 11. The first horizontal power line 32 passes through the pixel unit P along the second direction Y, for example, passes through the first pixel driving circuit PC1, the second pixel driving circuit PC2 and the third pixel driving circuit PC3 along the second direction Y. That is to say, an orthographic projection of the first horizontal power line 32 on the base substrate 11 has an overlapping area with each of orthographic projections of the first pixel driving circuit PC1, the second pixel driving circuit PC2 and the third pixel driving circuit PC3 on the base substrate 11. The second vertical power line 41 passes through the pixel unit P along the first direction X, for example, passes through the second pixel driving circuit PC2 or the third pixel driving circuit PC3 along the first direction X. That is to say, an orthographic projection of the second vertical power line 41 on the base substrate 11 has an overlapping area with the orthographic projection of the second pixel driving circuit PC2 or the third pixel driving circuit PC3 on the base substrate 11. The second horizontal power line 42 passes through the pixel unit P along the second direction Y, for example, passes through the first pixel driving circuit PC1, the second pixel driving circuit PC2 and the third pixel driving circuit PC3 along the second direction Y. That is to say, an orthographic projection of the second horizontal power line 42 on the base substrate 11 has an overlapping area with each of orthographic projections of the first pixel driving circuit PC1, the second pixel driving circuit PC2 and the third pixel driving circuit PC3 on the base substrate 11. FIG. 1 shows that one pixel unit P corresponds to one second vertical power line 41. In fact, however, as shown in FIG. 2, each pixel unit P corresponds to two second vertical power lines 41. One of the second vertical power lines 41 passes through the second pixel driving circuit PC2 along the first direction X, that is, an orthographic projection of this second vertical power line 41 on the base substrate 11 has an overlapping area with the orthographic projection of the second pixel driving circuit PC2 on the base substrate 11. The other second vertical power line 41 passes through the third pixel driving circuit PC3 along the first direction X, that is, an orthographic projection of this second vertical power line 41 on the base substrate 11 has an overlapping area with the orthographic projection of the third pixel driving circuit PC3 on the base substrate 11.

Those skilled in the art may understand that FIG. 1 does not show the first pixel driving circuit PC1, the second pixel driving circuit PC2 and the third pixel driving circuit PC3 respectively corresponding to the blue light emitting device the green light emitting device and the red light emitting device in the pixel unit P. FIG. 1 shows that the first power line 3 is connected to the blue light emitting device and the second power line 41 is connected to the green light emitting device and the red light emitting device. In fact, it only indicates that the first power line 3 is electrically connected to the first pixel driving circuit PC1 corresponding to the blue light emitting device, and the second power line 41 is electrically connected to the second pixel driving circuit PC2 and the third pixel driving circuit PC3 respectively corresponding to the green light emitting device and the red light emitting device.

In some embodiments, the first power signal ELVDD1 and the second power signal ELVDD2 may be the same or different.

In some embodiments, as shown in FIGS. 1 and 2, the first horizontal power line 32 and the second horizontal power line 42 extend in the same direction, that is, in the second direction Y, and the first vertical power line 31 and the second vertical power line 41 extend in the same direction, that is, in the first direction X.

In some embodiments, as shown in FIGS. 1 and 2, the orthographic projection of the first horizontal power line 32 on the base substrate 11 does not overlap the orthographic projection of the second horizontal power line 42 on the base substrate 11, and the orthographic projection of the first vertical power line 31 on the base substrate 11 does not overlap the orthographic projection of the second vertical power line 41 on the base substrate 11. In this way, the coupling capacitance formed by the first power line 3 and the second power line 4 may be reduced, thereby reducing the mutual crosstalk between the two during power supply.

In some embodiments, the first power line 3 and the second power line 4 are located in different layers. Specifically, the first power line 3 and the second power line 4 are made of different materials and are formed by different patterning processes. This may avoid the case that if the two power lines are arranged in the same layer, cross conduction of the first horizontal power line 32 and the second vertical power line 41 and cross conduction of the first vertical power line 31 and the first horizontal power line 42 may affect the normal power supply of the power lines.

Figure 3:
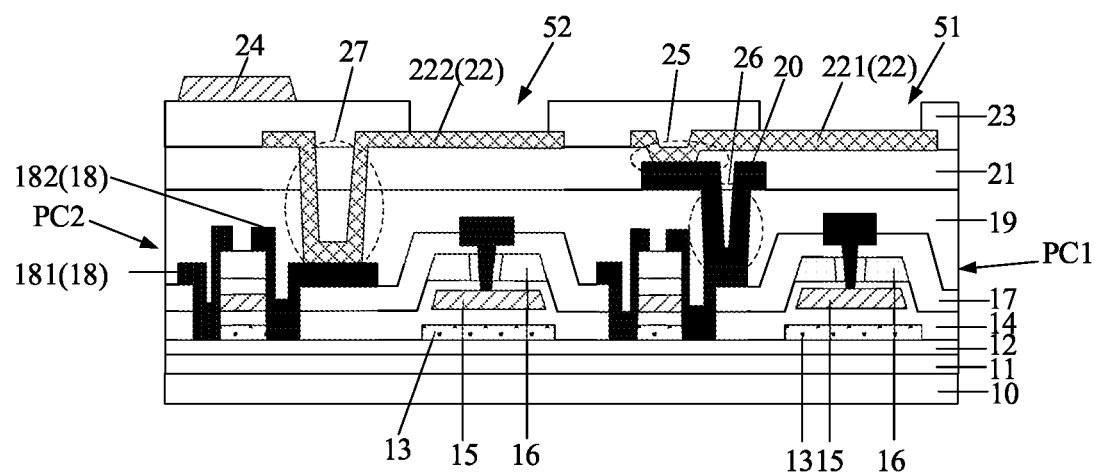
FIG. 3 shows a schematic diagram of a partial cross-sectional structure of a pixel unit according to some embodiments of the present disclosure.

FIG. 3 shows a schematic diagram of a partial cross-sectional structure of a pixel unit according to some embodiments of the present disclosure. In some embodiments, as shown in FIG. 3, each of the first pixel driving circuit PC1, the second pixel driving circuit PC2 and the third pixel driving circuit PC3 includes a thin film transistor located on a side of the base substrate 11 close to the corresponding light emitting device. The thin film transistor includes a source electrode 181 and a drain electrode 182 that are located in a source/drain electrode layer 18. At least a portion of the second power line 4 is arranged in the same layer as the source electrode 181 and the drain electrode 182 of the thin film transistor, that is, at least a portion of the second power line 4 is located in the source/drain electrode layer 18. Specifically, in some embodiments, the second vertical power line 41 is located in the source/drain electrode layer 18. FIG. 3 only shows a schematic diagram of a partial cross-sectional structure including the blue light emitting element, the green light emitting element, and the corresponding first pixel driving circuit PC1 and second pixel driving circuit PC2.

In some embodiments, as shown in FIG. 3, the array substrate further includes an anode layer 22 located on a side of the thin film transistor away from the base substrate 11, the blue light emitting device includes a first anode 221, the green light emitting device includes a second anode 222, and the red light emitting device includes a third anode. FIG. 3 only shows the first anode 221 and the second anode 222. The anode layer 22 includes the first anode 221, the second anode 222 and the third anode. The first power line 3 is located between the source/drain electrode layer 18 and the anode layer 22, for example, is arranged in the same layer as a connecting electrode 20.

In some embodiments, the first vertical power line 31, the first horizontal power line 32 and the first closed loop line in the first power line 3 are all arranged in the same layer as the connecting electrode 20. The first vertical power line 31, the first horizontal power line 32 and the first closed loop line may be integrally formed.

In some embodiments, as shown in FIG. 3, a first insulating layer 19 is provided between the first power line 3 and the source/drain electrode layers 18, and a second insulating layer 21 is provided between the first power line 3 and the anode layer 22.

In some embodiments, the first power line 3 is electrically connected to a source electrode of a thin film transistor (referred to as a first thin film transistor) through a first via hole penetrating the first insulating layer 19. The first thin film transistor is a thin film transistor in the first pixel driving circuit PC1. The source electrode of the first thin film transistor acts as the first power terminal of the first pixel driving circuit PC1 to receive the first power signal.

In some embodiments, the array substrate further includes the connecting electrode 20 located in the same layer as the first power line 3. The first anode 221 of the blue light emitting device is electrically connected to the connecting electrode through a second via hole 25 penetrating the second insulating layer 21. The connecting electrode 20 is electrically connected to a drain electrode of another thin film transistor (referred to as a second thin film transistor) through a third via hole 26 penetrating the first insulating layer 19. The second thin film transistor is also a thin film transistor in the first pixel driving circuit PC1. In this way, the first anode 221 of the blue light emitting device is supplied with power to control the light emission of the blue light emitting device 4.

In some embodiments, the second power line 4 is electrically connected to a source electrode of yet another thin film transistor (referred to as a third thin film transistor). Specifically, at least a portion of the second power line 4 (for example, the second vertical power line 41) is arranged in the same layer as the source electrode of the third thin film transistor, that is, arranged in the source/drain electrode layer. The second vertical power line 41 is in direct electrical contact with the source electrode of the third thin film transistor, and the two may be formed integrally, for example. The source electrode of the third thin film transistor acts as the second power terminal of the second pixel driving circuit PC2 to receive the second power signal. The second anode 222 of the green light emitting device is electrically connected to a drain electrode of another thin film transistor (referred to as a fourth thin film transistor) through a fourth via hole 27 penetrating the first insulating layer 19 and the second insulating layer 21. In this way, the second anode 222 of the green light emitting device is supplied with power to control the light emission of the green light emitting device. The third thin film transistor and the fourth thin film transistor are thin film transistors in the second pixel driving circuit PC2.

In some embodiments, for the red light emitting device and the corresponding third pixel driving circuit PC3, similar to the green light emitting device and the corresponding second pixel driving circuit PC2, the second power line 4 is electrically connected to a source electrode of another thin film transistor (referred to as a fifth thin film transistor). Specifically, at least a portion of the second power line 4 (for example, the second vertical power line 41) is arranged in the same layer as the source electrode of the fourth thin film transistor, that is, arranged in the source/drain electrode layer. The second vertical power line 41 is in direct electrical contact with the source electrode of the fifth thin film transistor, and the two may be formed integrally, for example. The source electrode of the fourth thin film transistor acts as the third power terminal of the third pixel driving circuit PC3 to receive the second power signal. The third anode of the red light emitting device is electrically connected to a drain electrode of another thin film transistor (referred to as a sixth thin film transistor) through a fifth via hole penetrating the first insulating layer 19 and the second insulating layer 21. In this way, the third anode of the red light emitting device is supplied with power to control the light emission of the red light emitting device. The fifth thin film transistor and the sixth thin film transistor are thin film transistors in the third pixel driving circuit PC3.

In some embodiments, in a direction from the base substrate 11 to the source/drain electrode layer 18, the array substrate may further include a buffer layer 12, an active layer 13 (for example, a polysilicon active layer P-Si), a gate insulating layer 14, a first gate electrode layer 15, a second gate electrode layer 16 and an interlayer dielectric layer 17 sequentially arranged between the base substrate 11 and the source/drain electrode layer 18 of the thin film transistor. The gate insulating layer 14 may specifically include a first gate insulating layer and a second gate insulating layer arranged sequentially away from the base substrate 11. The first gate electrode layer 15 may be specifically located between the first gate insulating layer and the second gate insulating layer, and the second gate electrode layer 16 is located on a side of the second gate insulating layer away from the first gate electrode layer 15. During the manufacturing process, the base substrate 11 may specifically be located on a glass substrate 10. The array substrate may further include a pixel defining layer 23 and a spacer 24 sequentially arranged on a side of the anode layer 22 facing away from the base substrate 11. The above is only an example of the layer structure of the array substrate, and the embodiments of the present disclosure are not limited thereto.

In some embodiments, the gate electrodes of the thin film transistors in the first pixel driving circuit PC1, the second pixel driving circuit PC2 and the third pixel driving circuit PC3 are all located in the first gate electrode layer 15.

In some embodiments, for the second power line 4, the second vertical power line 41 is located in the source/drain electrode layer 18, and the second horizontal power line 42 is located in the second gate electrode layer 16, so as to avoid the same-layer crossing with data lines that extend along the first direction X in the source/drain electrode layer 18 and that are configured to provide data signals to each pixel driving circuit. The second closed loop line is located in the source/drain electrode layer 18. The second vertical power cord 41 and the second horizontal power line 42 are arranged to cross each other, that is, the orthographic projection of the second vertical power line 41 on the base substrate 11 has a first overlapping area 44 with the orthographic projection of the second horizontal power line 42 on the base substrate 11. The second vertical power line 41 is electrically connected to the second horizontal power line 42 through the sixth via hole 45. The orthographic projection of the second closed loop line on the base substrate 11 has a second overlapping area with the orthographic projection of the second horizontal power line 42 on the base substrate 11, that is, the second closed loop line overlaps the second horizontal power line 42 at both ends of the second horizontal power line 42. The second closed loop line is electrically connected to the second horizontal power line 42 through the sixth via hole 47. In some embodiments, the second vertical power line 41 and the second closed loop line 33 in the second power line 4 are arranged in the same layer and electrically connected to each other, and may be integrally formed.

Figure 4:
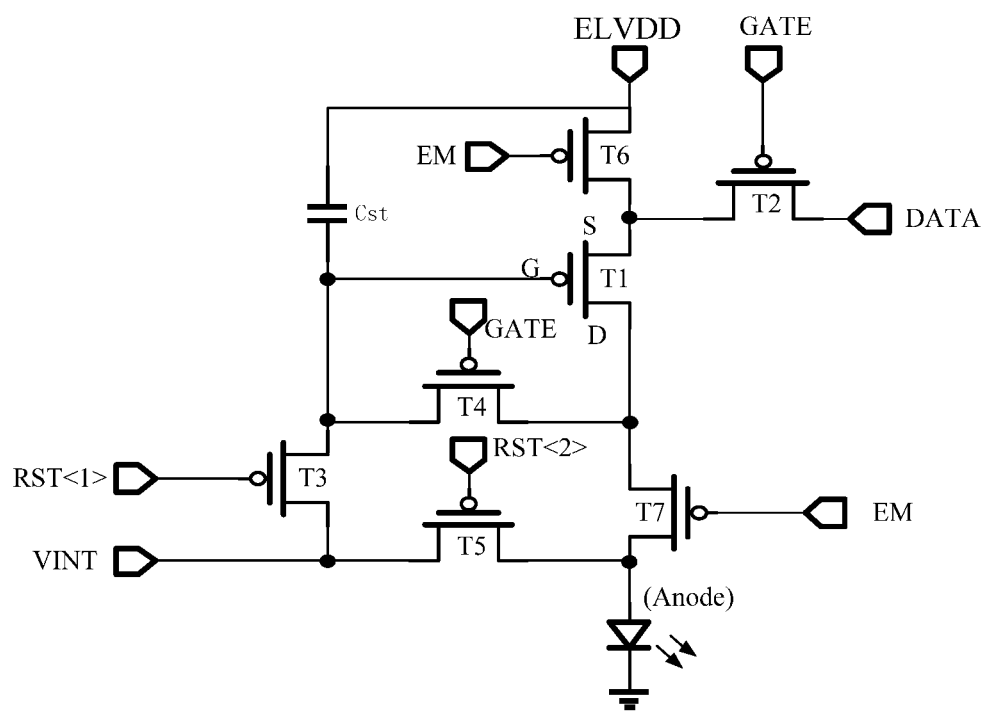
FIG. 4 shows a schematic structural diagram of a pixel driving circuit according to some embodiments of the present disclosure.

In some embodiments, each of the first pixel driving circuit PC1, the second pixel driving circuit PC2 and the third pixel driving circuit PC3, as shown in FIG. 4, may specifically include a first driving thin film transistor T1, a second switching thin film transistor T2, a third switching thin film transistor T3, a fourth switching thin film transistor T4, a fifth switching thin film transistor T5, a sixth switching thin film transistor T6, a seventh switching thin film transistor T7, and a capacitor Cst. The third switching thin film transistor T3 has a gate electrode for receiving a first reset signal RST<1>, a source electrode electrically connected to a first plate of the capacitor Cst, a gate electrode of the first driving thin film transistor T1 and a source electrode of the fourth switching thin film transistor T4, and a drain electrode electrically connected to a source electrode of the fifth switching thin film transistor T5 to receive an initialization signal VINT. The capacitor Cst has a second plate electrically connected to a source electrode of the sixth switching thin film transistor T6. The sixth switching thin film transistor T6 has the source electrode for receiving a power signal ELVDD (for example, the first power signal ELVDD1 or the second power signal ELVDD2), a gate electrode for receiving a control signal EM, and a drain electrode electrically connected to a drain electrode of the second switching thin film transistor T2 and a source electrode of the first driving thin film transistor T1. The first driving thin film transistor T1 has a drain electrode electrically connected to a drain electrode of the fourth switching thin film transistor T4 and a source electrode of the seventh switching thin film transistor T7. The fourth switching thin film transistor T4 has a gate electrode for receiving a gate signal GATE. The fifth switching thin film transistor T5 has a gate electrode for receiving a second reset signal RST<2>, and a drain electrode electrically connected to the drain electrode of the seventh switching thin film transistor and the anode of the light emitting device. The seventh switching thin film transistor T7 has a gate electrode for receiving the control signal EM. The second switching thin film transistor T2 has a gate electrode for receiving a gate signal GATE, and a source electrode for receiving a data signal DATE.

When the first pixel driving circuit PC1 corresponding to the blue light emitting device his the pixel driving circuit shown in FIG. 4, the first power terminal of the first pixel driving circuit PC1 corresponding to the blue light emitting device may specifically be the source electrode of the sixth switching thin film transistor T6, the first thin film transistor of the first pixel driving circuit PC1 may specifically be the sixth switching thin film transistor T6 in FIG. 4, and the second thin film transistor of the first pixel driving circuit PC1 may specifically be the seventh switching thin film transistor T7 in FIG. 4. That is, the first power line 3 may be electrically connected to the source electrode of the sixth switching thin film transistor T6 through the first via hole penetrating the first insulating layer 19, and may supply power to the first anode 221 of the blue light emitting device through the first driving thin film transistor T1 and the seventh switching thin film transistor T7.

Similarly, when the second pixel driving circuit PC2 corresponding to the green light emitting device is the pixel driving circuit shown in FIG. 4, the second power terminal of the second pixel driving circuit PC2 corresponding to the green light emitting device may specifically be the source electrode of the sixth switching thin film transistor T6, the third thin film transistor of the second pixel driving circuit PC2 may specifically be the sixth switching thin film transistor T6 in FIG. 4, and the fourth thin film transistor of the second pixel driving circuit PC2 may specifically be the seventh switching thin film transistor T7 in FIG. 4. That is, the second power line 4 may be electrically connected to the source electrode of the sixth switching thin film transistor T6, and may supply power to the second anode 222 of the green light emitting device through the first driving thin film transistor T1 and the seventh switching thin film transistor T7. The pixel driving circuit of the red light emitting device has the same principle as the pixel driving circuit of the green light emitting device, which will not be repeated here.

It should be noted that the above is only an example of the pixel driving circuit where the pixel driving circuit includes seven thin film transistors and one capacitor (7T1C structure). In specific implementation, the pixel driving circuit may also be other types of pixel driving circuits, which are not limited in the present disclosure. For example, the pixel driving circuit may also be a pixel driving circuit including a 2T1C structure (that is, the pixel driving circuit includes one driving transistor, one switching transistor and one capacitor). For different pixel driving circuit, the specific power terminal for receiving the power signal may be different. For example, when the pixel driving circuit is the pixel driving circuit shown in FIG. 4, the power terminal is the source electrode of the sixth switching thin film transistor, but in the case of a different pixel driving circuit, the power terminal may not be the source electrode of the sixth switching thin film transistor, and it may be a terminal for receiving the power signal ELVDD (for example, the first power signal ELVDD1 or the second power signal ELVDD2), such as the above-mentioned first power terminal, second power terminal or third power terminal in the pixel driving circuit.

Based on the same inventive concept, some embodiments of the present disclosure further provide a display panel, including the array substrate provided by the embodiments of the present disclosure. In some embodiments, the display panel further includes a cover plate attached to the array substrate to protect each structure formed on the array substrate. In some embodiments, the display panel is, for example, an OLED display panel.

Based on the same inventive concept, some embodiments of the present disclosure further provide a display device, including the display panel provided by the embodiments of the present disclosure. The display device may be any product or component with a display function and a camera function, such as a TV, a monitor, a digital photo frame, a mobile phone, a smart watch, and a tablet computer.

The array substrate provided by the embodiments of the present disclosure includes a base substrate, a plurality of pixel units, and a first power line and a second power line. The plurality of pixel units are arranged in an array on the base substrate. The first power line and the second power line are arranged on the base substrate and are configured to respectively provide a first power signal and a second power signal to the plurality of pixel units. At least one of the pixel units includes a first-color light emitting device, a second-color light emitting device, a first pixel driving circuit, and a second pixel driving circuit. The first pixel driving circuit is configured to drive the first-color light emitting device, and the second pixel driving circuit is configured to drive the second-color light emitting device. The first pixel driving circuit is electrically connected to the first power line, the second pixel driving circuit is electrically connected to the second power line, and the first power line and the second power line are insulated from each other. The first pixel driving circuit for driving the first-color light emitting element and the second pixel driving circuit for driving the second-color light emitting element are electrically connected to different power lines, that is, the first power line and the second power line, and are respectively driven by independent power lines, which may improve the problems of mid-to-high grayscale color shift and cyan display in the OLED display panel in the related art when displaying mid-to-high grayscale images. This avoids the problems of mid-to-high grayscale color shift and insufficient white image brightness in the OLED display panel when displaying mid-to-high grayscale images due to the current path of the blue light emitting device with a large current consumption may occupy the current path of the green light emitting device which is a main light emitting device in the case that in the array substrate of the OLED display panel, the power lines corresponding to the red light emitting device, the green light emitting device and the blue light emitting device of each pixel unit P are connected together.

Obviously, those skilled in the art may make various modifications and variations to the present disclosure without departing from the spirit and scope of the present disclosure. In this way, if these modifications and variations of the present disclosure fall within the scope of the claims of the present disclosure and their equivalent technologies, the present disclosure is also intended to include these modifications and variations.

What is claimed is:

1. An array substrate, comprising:
   a base substrate;
   a plurality of pixel units arranged in an array on the base substrate; and
   a first power line and a second power line arranged on the base substrate and configured to respectively provide a first power signal and a second power signal to the plurality of pixel units,
   wherein at least one of the pixel units comprises:
   a first-color light emitting device;
   a second-color light emitting device;
   a first pixel driving circuit configured to drive the first-color light emitting device, wherein the first-color light emitting device is a blue light emitting device; and
   a second pixel driving circuit configured to drive the second-color light emitting device;
   wherein the first pixel driving circuit is electrically connected to the first power line, the second pixel driving circuit is electrically connected to the second power line, and the first power line and the second power line are insulated from each other,
   wherein the first power line comprises:
   a first sub-line extending in a first direction and electrically connected to the first pixel driving circuit;
   a second sub-line extending in a second direction intersecting the first direction, wherein the second sub-line is electrically connected to the first sub-line; and
   a third sub-line arranged around the plurality of pixel units, wherein the third sub-line is electrically connected to the first sub-line and the second sub-line, and the third sub-line is a closed loop line.

2. The array substrate according to claim 1, wherein the at least one pixel unit further comprises:
   a third-color light emitting device; and
   a third pixel driving circuit configured to drive the third-color light emitting device,
   wherein the third pixel driving circuit is electrically connected to the second power line.

3. The array substrate according to claim 2, wherein the first power line and the second power line are located in different layers.

4. The array substrate according to claim 3, wherein each of the first pixel driving circuit, the second pixel driving circuit and the third pixel driving circuit comprises a thin film transistor, the thin film transistor is configured to drive one of the first-color light emitting device, the second-color light emitting device and the third-color light emitting device, the thin film transistor comprises a source electrode and a drain electrode which are located in a source/drain electrode layer; and at least a portion of the second power line is arranged in the same layer as the source electrode and drain electrode of the thin film transistor.

5. The array substrate according to claim 4, wherein each of the first-color light emitting device, the second-color light emitting device and the third-color light emitting device comprises an anode located on a side of the thin film transistor away from the base substrate, the anode is located in an anode layer, and the first power line is located between the source/drain electrode layer and the anode layer.

6. The array substrate according to claim 5, further comprising:
   a first insulating layer arranged between the first power line and the source/drain electrode layer; and
   a second insulating layer arranged between the first power line and the anode layer.

7. The array substrate according to claim 6, wherein the first pixel driving circuit comprises a first power terminal located in the source/drain electrode layer, and the first power line is electrically connected to the first power terminal through a first via hole penetrating the first insulating layer.

8. The array substrate according to claim 6, further comprising a connecting electrode arranged in the same layer as the first power line; wherein the anode of the first-color light emitting device is electrically connected to the connecting electrode through a second via hole penetrating the second insulating layer, and the connecting electrode is electrically connected to the drain electrode of the thin film transistor in the first pixel driving circuit through a third via hole penetrating the first insulating layer.

9. The array substrate according to claim 6, wherein the second pixel driving circuit comprises a second power terminal, and the third pixel driving circuit comprises a third power terminal, the second power terminal and the third power terminal are located in the source/drain electrode layer, and the at least portion of the second power line is in electrical contact with the second power terminal or the third power terminal.

10. The array substrate according to claim 6, wherein,
    the anode of the second-color light emitting device is electrically connected to the drain electrode of the thin film transistor in the second pixel driving circuit through a fourth via hole penetrating the first insulating layer and the second insulating layer; and/or
    the anode of the third-color light emitting device is electrically connected to the drain electrode of the thin film transistor in the third pixel driving circuit through a fifth via hole penetrating the first insulating layer and the second insulating layer.

11. The array substrate according to claim 1, wherein the first sub-line, the second sub-line and the third sub-line are integrally formed.

12. The array substrate according to claim 4, wherein the second power line comprises a fourth sub-line extending in the first direction and electrically connected to the second pixel driving circuit or the third pixel driving circuit, wherein the fourth sub-line is arranged in the same layer as the source electrode and drain electrode of the thin film transistor.

13. The array substrate according to claim 12, wherein the second power line further comprises a fifth sub-line extending in a second direction intersecting the first direction, wherein the fifth sub-line is arranged in a different layer from the fourth sub-line, an orthographic projection of the fifth sub-line on the base substrate has a first overlapping area with an orthographic projection of the fourth sub-line on the base substrate, and the fifth sub-line is electrically connected to the fourth sub-line through a sixth via hole located in the first overlapping area.

14. The array substrate according to claim 13, wherein the thin film transistor further comprises a gate electrode located in a first gate electrode layer that is located on a side of the source/drain electrode layer close to the base substrate, and the fifth sub-line is located in a second gate electrode layer provided between the first gate electrode layer and the source/drain electrode layer.

15. The array substrate according to claim 13, wherein the first power line further comprises a sixth sub-line arranged around the plurality of pixel units, wherein the sixth sub-line is arranged in the same layer as the fourth sub-line and is electrically connected to the fourth sub-line, the orthographic projection of the fifth sub-line on the base substrate has a second overlapping area with an orthographic projection of the sixth sub-line on the base substrate, and the fifth sub-line is electrically connected to the sixth sub-line through a seventh via hole located in the second overlapping area.

16. The array substrate according to claim 15, wherein the fourth sub-line and the sixth sub-line are integrally formed.

17. A display panel comprising the array substrate according to claim 1.

* * * * *